United States Patent [19]
Wallace et al.

[11] Patent Number: 6,024,801
[45] Date of Patent: Feb. 15, 2000

[54] METHOD OF CLEANING AND TREATING A SEMICONDUCTOR DEVICE INCLUDING A MICROMECHANICAL DEVICE

[75] Inventors: Robert M. Wallace, Dallas; Monte A. Douglas, Coppell, both of Tex.

[73] Assignee: Texas Instruments Incorporated, Dallas, Tex.

[21] Appl. No.: 08/761,579

[22] Filed: Dec. 9, 1996

Related U.S. Application Data

[63] Continuation of application No. 08/455,466, May 31, 1995, abandoned.

[51] Int. Cl.$^7$ ...................................................... B08B 3/00
[52] U.S. Cl. ................................ 134/1; 134/1.3; 134/26; 134/30; 427/299; 438/694; 438/770; 438/771
[58] Field of Search .................................. 134/1, 1.3, 19, 134/26, 30; 427/299; 438/694, 770, 771

[56] References Cited

U.S. PATENT DOCUMENTS

| | | | |
|---|---|---|---|
| 4,662,746 | 5/1987 | Hornbeck | 350/269 |
| 4,710,732 | 12/1987 | Hornbeck | 332/7.51 |

(List continued on next page.)

OTHER PUBLICATIONS

Bok et al. "Supercritical fluids for single wafer cleaning" Solid state technology, pp. 117–120, Jun. 1992.

Spall, et al., "Supercritical Carbon Dioxide Precision Cleaning for Solvent and Waste Reduction" International Journal of Environmentally Conscious Design & Manufacturing, vol. 2. No. 1, 1993 pp. 81–86.

Core, et al., "Fabrication Technology for an Integrated surface–Micromachined Sensor" Solid State Technology Oct. 1993.,pp. 39–47.

Walsh, et al., "Overcoming Stiction in MEMS Manufacturing" Micro, Mar. 1995.,pp. 49–58.

U.S. application No. 08/239,497, Wallace et al., filed May 9, 1994.

U.S. application No. 08/424,021, Hornbeck, filed Apr. 18, 1995.

U.S. application No. 08/171,303, Hornbeck, filed Dec. 21, 1993.

Muller, et al., "Concentrations of Organic Vapors and Their Surface Arrival Rates at Surrogate Wafers During Processing in Clean Rooms" Symposium on Semiconductor Cleaning Technology, 1989.,Proceedings vol. 90–9.,pp. 204–211.

Alley, et al., "The Effect of Release–Etch Processing on Surface Microstructure Stiction" IEEE 1992., pp. 202–207.

Mulhern, et al., "Supercritical Carbon Dioxide Drying of Microstructures"???? 1993., pp. 276–294.

Primary Examiner—Randy Gulakowski
Assistant Examiner—Saeed Chaudhry
Attorney, Agent, or Firm—Charles A. Brill; Frederick J. Telecky, Jr.; Richard L. Donaldson

[57] ABSTRACT

A method of cleaning and treating a device, including those of the micromechanical (10) and semiconductor type. The surface of a device, such as the landing electrode (22) of a digital micromirror device (10), is first cleaned with a supercritical fluid (SCF) in a chamber (50) to remove soluble chemical compounds, and then maintained in the SCF chamber until and during the subsequent passivation step. Passivants including PFDA and PFPE are suitable for the present invention. By maintaining the device in the SCF chamber, and without exposing the device to, for instance, the ambient of a clean room, organic and inorganic contaminants cannot be deposited upon the cleaned surface prior to the passivation step. The present invention derives technical advantages by providing an improved passivated surface that is suited to extend the useful operation life of devices, including those of the micromechanical type, reducing stiction forces between contacting elements such as a mirror and its landing electrode. The present invention is also suitable for cleaning and passivating other surfaces including a surface of semiconductor wafers, and the surface of a hard disk memory drive.

23 Claims, 2 Drawing Sheets

U.S. PATENT DOCUMENTS

| | | | |
|---|---|---|---|
| 4,956,619 | 9/1990 | Hornbeck | 330/4.3 |
| 5,061,049 | 10/1991 | Hornbeck | 359/224 |
| 5,068,040 | 11/1991 | Jackson | 134/1 X |
| 5,079,544 | 1/1992 | DeMond et al. | 340/701 |
| 5,083,857 | 1/1992 | Hornbeck | 359/291 |
| 5,096,279 | 3/1992 | Hornbeck et al. | 359/230 |
| 5,105,369 | 4/1992 | Nelson | 364/525 |
| 5,172,262 | 12/1992 | Hornbeck | 359/223 |
| 5,233,456 | 8/1993 | Nelson | 359/214 |
| 5,278,652 | 1/1994 | Urbanus et al. | 358/160 |
| 5,302,212 | 4/1994 | Desbiendras et al. | 134/40 |
| 5,331,454 | 7/1994 | Hornbeck | 359/224 |
| 5,399,192 | 3/1995 | Yamasoe | 106/186 |
| 5,401,322 | 3/1995 | Marshall | 134/1 X |
| 5,403,665 | 4/1995 | Alley et al. | 427/435 |
| 5,456,759 | 10/1995 | Stanford, Jr. et al. | 134/1 |
| 5,494,526 | 2/1996 | Paranjpe | 134/1 |
| 5,814,562 | 9/1998 | Green et al. | 438/708 |
| 5,868,856 | 2/1999 | Douglas et al. | 134/2 |
| 5,869,405 | 2/1999 | Gonzalez et al. | 438/770 |

METHOD OF CLEANING AND TREATING A SEMICONDUCTOR DEVICE INCLUDING A MICROMECHANICAL DEVICE

This application is a continuation of application Ser. No. 08/455,466, filed May 31, 1995 now abandoned.

REFERENCE TO RELATED APPLICATIONS

| SERIAL NUMBER | TITLE | FILED |
| --- | --- | --- |
| 08/239,497 | PFPE Coatings for Micro-Mechanical Devices | 05/09/94 |
| 08/424,021 | Active Yoke Hidden Hinge Digital Micromirror Device | 04/18/95 |

TECHNICAL FIELD OF THE INVENTION

The present invention relates generally to cleaning and treating a semiconductor surface, and more particularly, to a method of cleaning and passivating a micromechanical device including a digital micromirror device (DMD) spatial light modulator (SLM).

BACKGROUND OF THE INVENTION

Cleaning and passivating semiconductor surfaces, including those of the micromechanical-type, is difficult due to their architectures which may comprise spatially-convoluted, micron/submicron-scale features. A recent innovation of Texas Instruments Incorporated of Dallas, Tex. is the digital micromirror device or the deformable mirror device (collectively DMD). The DMD is an electro/mechanical/optical Spatial Light Modulator (SLM) suitable for use in displays, projectors and hard copy printers. The DMD is a monolithic single-chip integrated circuit SLM, comprised of a high density area or linear array of 16 micron square deflectable micromirrors on 17 micron centers. These mirrors are fabricated over address circuitry including an array of SRAM cells and address electrodes which generate electrostatic attraction forces. Each mirror forms one pixel of the DMD array and may be monostable, or bistable, that is to say, stable in one of two positions, wherein a source of light directed upon the mirror array will be reflected in one of two directions. In one stable "on" mirror position, incident light to that mirror will be reflected to a projector lens and focused on a display screen or a photosensitive element of a printer. In the other "off" mirror position, light directed on the mirror will be deflected to a light absorber. Each mirror of the array is individually controlled to either direct incident light into the projector lens, or to the light absorber. The projector lens ultimately focuses and magnifies the modulated light from the pixel mirrors onto a display screen and produce an image in the case of a display. If each pixel mirror of the DMD array is in the "on" position, the displayed image will be an array of bright pixels.

For a more detailed discussion of the DMD device and uses, cross reference is made to U.S. Pat. No. 5,061,049 to Hornbeck, entitled "Spatial Light Modulator and Method"; U.S. Pat. No. 5,079,544 to DeMond, et al, entitled "Standard Independent Digitized Video System"; and U.S. Pat. No. 5,105,369 to Nelson, entitled "Printing System Exposure Module Alignment Method and Apparatus of Manufacture", each patent being assigned to the same assignee of the present invention and the teachings of each are incorporated herein by reference. Gray scale of the pixels forming the image is achieved by pulse-width modulation techniques of the mirrors, such as that described in U.S. Pat. No. 5,278,652, entitled "DMD Architecture and Timing for Use in a Pulse-Width Modulated Display System", assigned to the same assignee of the present invention, and the teachings of which are incorporated herein by reference.

The DMD is revolutionary in that it is truly a digital display device and an integrated circuit solution. The evolution and variations of the DMD can be appreciated through a reading of several commonly assigned patents. The "first generation" of DMD spatial light modulators implemented a deflectable beam wherein the mirror and the beam were one in the same. That is, an electrostatic force was created between the mirror and the underlying address electrode to induce deflection thereof The deflection of these mirrors can be variable and operate in the analog mode, and may comprise a leaf-spring or cantilevered beam, as disclosed in commonly assigned U.S. Pat. No. 4,662,746 to Hornbeck, entitled "Spatial Light Modulator and Method", U.S. Pat. No. 4,710,732 to Hornbeck, entitled "Spatial Light Modulator and Method", U.S. Pat. No. 4,956,619 to Hornbeck, entitled "Spatial Light Modulator", and U.S. Pat. No. 5,172,262 to Hornbeck, entitled "Spatial Light Modulator and Method", the teachings of each incorporated herein by reference.

A "second generation" of the DMD is embodied in commonly assigned U.S. Pat. No. 5,083,857 entitled "Multi-Level Deformable Mirror Device",as well as in co-pending patent application Ser. No. 08/171,303 entitled "Improved Multi-Level Digital Micromirror Device, filed Dec. 21, 1993. In this second generation device, the mirror is elevated above a yoke, this yoke being suspended over the addressing circuitry by a pair of torsion hinges. As depicted in FIG. 3c of this application, an electrostatic force is generated between the elevated mirror and an elevated electrode. When rotated, it is the yoke that comes into contact with a landing electrode, whereby the mirror tips never come into contact with any structure. The shorter moment arm of the yoke, being about 50% of the mirror, allows energy to be more efficiently coupled into the mirror by reset pulses due to the fact that the mirror tip is free to move. Applying resonant reset pulses to the mirror to help free the pivoting structure from the landing electrode is disclosed in commonly assigned U.S. Pat. No. 5,096,279, entitled "Spatial Light Modulator and Method, and U.S. Pat. No. 5,233,456 entitled "Resonant Mirror and Method of Manufacture". However, some of the address torque generated between the mirror and the elevated address electrode is sacrificed compared to the first generation devices because the yoke slightly diminishes the surface area of the address electrode.

In operation, the deflectable mirror of the DMD, or the yoke supporting the elevated mirror, will land upon and engage a landing electrode. This movable element is subject to stiction forces, which is commonly known as the tendency of a movable element to stick to the engaged element or pad. This phenomenon is due to many known and unknown physical characteristics and features of the parts, and can include Van der Waals forces, friction, and adhesion. One solution minimizing the tendency for a micromechanical device to stick to an engaged element is to passivate the engaged element, as disclosed in commonly assigned U.S. Pat. No. 5,331,454 to Hornbeck, entitled "Low Reset Voltage Process for DMD", the teachings of which is incorporated herein by reference. An orientated monolayer passivated upon the landing electrode of the spatial light modulator element such that when the element (mirror or yoke) is activated and deflects to come in contact with the landing electrode, the orientated monolayer decreases the Van der Waals and stiction forces to reduce the tendency for the element to stick to the electrode.

As disclosed in commonly assigned co-pending patent application Ser. No. 08/239,497 entitled "PFPE coatings for Micro-Mechanical Devices", a layer of perfluoropolyether (PFPE) is passivated upon the landing electrode. PFPE is characterized as having "self-healing" tendencies whereby the molecules will migrate to repair a worn surface when the beam is not engaging the landing electrode. Using PFDA or PFPE, passivating the landing electrode has proved to remarkably reduce stiction in micromechanical devices.

The physical attributes of micromechanical surfaces, and methods for passivating the same, has proven to be a challenging and yet to be fully understood science. Simply passivating a surface may not be sufficient to adequately reduce stiction forces for the extended useful life of the device. Cleaning and preparation of the landing electrode before passivation has proven to be a critical procedure if acceptable passivation is to be achieved.

It is well known in the art to employ a supercritical fluid (SCF) to displace a non-SC liquid ambient after a wet chemical process, in effect, to dry the surface. One article authored by Gregory T. Mulhern entitled "Supercritical Carbon Dioxide Drying of Micro Structures" discusses using supercritical carbon dioxide to dry microstructures. This technique is useful for drying a surface when surface tension effects are critical. By immersing structures in liquid and then going through a transition into the supercritical region, all surface tension effects can be avoided. In an article authored by R. L. Alley, et al. entitled "The Effect of Release-etch Processing on Surface Microstructure Stiction", there is discussed reducing stiction or unwanted adhesion which occurs after release etch, rinse and dry processing. This article notes that a residue dissolved in the water and redeposited during drying is responsible for one form of adhesion, by solid bridging. A self-assembled monolayer treatment is discussed as being integrated into the post-release rinse processing to provide a durable, hydrophobic, low-energy surface coverage that should reduce the susceptibility to stiction. The films form very low surface energies to alleviate stiction. Both the articles authored by Alley, et al. and Mulhern specifically focus on releasing stuck parts which arise out of the wet chemical process employed.

In an article authored by Edward Bok, et al. entitled "Supercritical Fluids for Single Wafer Cleaning", a wafer cleaning system is discussed. A supercritical fluid, such as carbon dioxide, is cycled between two pressures so that contaminants and particles on a wafer can be effectively dislodged during the expansion phase of the pulsation. Additives may be included to modify the chemical properties, polarity, or solvating power of the fluid. For example, $O_2$, $O_3$, or $H_2O_2$ may be used to oxidize the wafer surface or organic contaminants. Chemical treatments such as HF etching (wet or anhydrous) are notorious for an electrostatically active wafer surface which attracts particle and chemical contaminants. Such oxide removal or cleaning processes are usually followed by further processing to clean and passivate the wafer surface. Cleaning with a $CO_2$ supercritical fluid alleviates the electrostatic problem because the volume of fluid between the wafer and the cleaning chamber metal walls is minimized. The system is noted as ideally suited for single wafer, cluster-tool configurations where supercritical fluid cleaning can provide a contaminant free, passivated surface between various processing steps.

In an article authored by W. Dale Spall, entitled "Supercritical carbon dioxide Precisian Cleaning for Solvent and Waste Reduction", a supercritical carbon dioxide cleaning solvent is discussed. Supercritical carbon dioxide is applied for the removal of organic compounds with mid-to-low volatilities. The enhanced solubility of organic compounds in the supercritical state forms the basis for using supercritical fluids as cleaning solvents. The low viscosity, low surface tension, high density, and high diffusion rates mean that supercritical fluids can readily penetrate into small regions to remove contaminants.

In an article authored by Theresa A. Core, et al. entitled "Fabrication Technology for an Integrated Surface-Machined Sensor", a supercritical carbon dioxide is discussed to clean the surface before a wafer drys. The supercritical phase of the fluid exhibits no surface tension, and thus will not damage the wafer surface.

In an article authored by Steven T. Walsh, et al. entitled "Overcoming Stiction in MEMS Manufacturing", the problem of surface tension because of a liquid/solid interface is discussed. To avoid stiction, it is suggested that supercritical carbon dioxide drying is suitable to solve the surface tension problem because a liquid/solid interface is never formed.

The state of the art recognizes that a supercritical fluid (SCF) is effective to remove liquids, i.e. dry, surfaces associated with wet chemical processing. Using a supercritical fluid to release components stuck by liquid-solid surface tension forces is recognized. However, it is not recognized in the art to utilize a SCF to clean a surface in preparation of passivation of a micromechanical device, which device has a component that makes repetitive contact during operation of the part with the passivated surface. Thus, the prior art addresses processing a component to remove liquid contaminants derived from wet-chemical process-related sticking, not the operational post-processing sticking which can occur in micromechanical device such as the DMD.

There is a need in the industry to preserve surface integrity after SCF cleaning, to achieve an effective passivation treatment for devices having components making repetitive contact over the life of the device. An effective passivation increases the device yield, performance, and especially, long-term reliability. In particular, there is a need to preserve a surface free of contaminants, especially organic contaminants, which can preclude an effective passivation treatment suitable for the life of the device. Simply cleaning a surface with a supercritical fluid, transferring the surface through an ambient clean room environment and then passivating the cleaned surface can degrade or compromise the entire passivation treatment due to the deposition of clean room organic contaminants. Clean rooms may have a low particle count, but contain organic and inorganic vapors, solvents, perfumes, and moisture that potentially degrade the cleaned surface prior to passivation. The presence of various organic species on surfaces exposed to clean room ambients has been reported by A. J. Muller, et al. in the reference entitled "Concentrations of Organic Vapors and Their Surface Arrival Rates at Surrogate Wafers During Processing in Clean Rooms". Water vapor at 20 Torr can potentially degrade a device surface. Thus, the present invention sets out to achieve an effective method for cleaning and passivating a semiconductor surface, especially a micromechanical device such as those of the DMD type.

SUMMARY OF THE INVENTION

The present invention achieves technical advantages by cleaning a semiconductor surface with a supercritical fluid to remove soluble chemical compounds, maintaining the cleaned part in the cleaned SCF chamber to preserve the surface integrity of the part so crucial to successive subsequent lubrication application, and then passivating the surface. By maintaining the cleaned part in the SCF chamber, at a sufficiently low pressure to avoid the deposition of chemical compounds including organic material, moisture, hydrocarbons, and other contaminants, the subsequent lubricant passivation treatment of the surface is very effective to reduce stiction over the operational life of the device.

An ultra-high vacuum technique is utilized whereby surfaces can be rendered clean in the SCF chamber for hours if necessary, until the surface is passivated. As is crucial in a successful passivation process, the surface is passivated after a SCF cleaning process, but before the part is removed from the SCF chamber. The invention eliminates the deposition of chemical compounds on the molecular level including organics, which are present even in an ambient clean room environment. The present invention is well suited for micromechanical devices which have one element enduring a repeated contact with another element. However, the present invention is also well suited for treating a semiconductor surface, such as a very thin layer of gate oxide having a thickness on the order of a few molecules, such as 30 Angstroms, in preparation for a subsequent process or treatment, and for passivating a hard disk drive. Thus, cleaning and maintaining a semiconductor device in a clean SCF chamber after the SCF cleaning process and until the device surface is passivated, is encompassed by the present invention.

DETAIL DESCRIPTION OF THE PREFERRED EMBODIMENT

Figure 1:
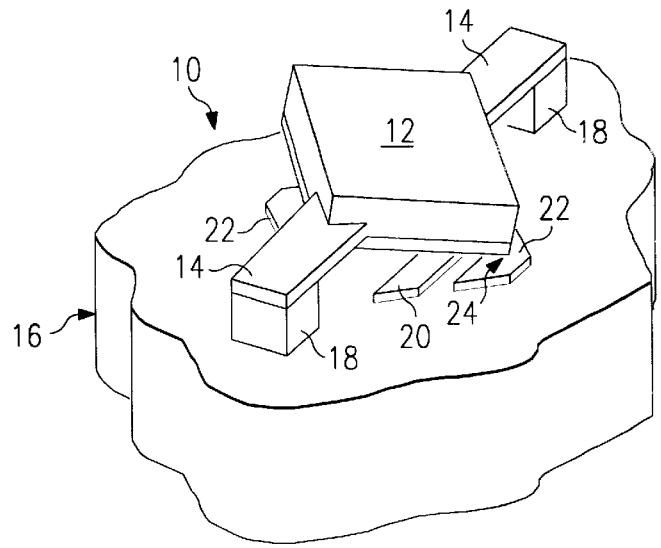
FIG. 1 is a perspective view of a prior art digital micromirror device of the micromechanical type, having a deflectable mirror which engages a landing electrode in one of two bistable positions, when stiction can occur between the landing tip and the landing electrode, especially when the landing electrode is ineffectively passivated.

By way of illustration, but without any limitation to, the preferred embodiment of the present invention will be set forth in reference to cleaning and passivating the landing electrode of a bistable digital micromirror device (DMD) spatial light modulator, such as that shown in FIG. 1. However, it is to be understood that the method of the present invention is suitable to clean and passivate other surfaces including, but without limitation to, a semiconductor wafer, or a hard disk of a disk drive.

Referring to FIG. 1, a digital micromirror device (DMD) comprising one pixel is generally shown at 10. When used as a spatial light modulator, pixel 10 comprises of one of thousands such pixels arranged in a linear or area array to modulate incident light and generate an image, as set forth in the several cross referenced commonly assigned patents previously discussed in a section entitled Background of the Invention.

Pixel 10 is seen to include a beam comprising a mirror 12 supported by a torsion hinge 14 above a silicon substrate 16. In other embodiment, the beam could comprise a yoke supporting an elevated mirror, as disclosed in commonly assigned U.S. patent application Ser. No. 08/424,021, entitled "Active Yoke Hidden Hinge Digital Micromirror Device" filed Apr. 18, 1995, the teachings of which is incorporated herein by reference. A pair of support posts 18 support torsion hinges 14 each side of mirror 12, whereby mirror 12 is suspended over a pair of opposing address electrodes 20 and a pair of opposing mirror landing electrodes generally shown at 22. Mirror 12 is bistable, that is to say, stable in one of two landing states. Mirror 12 is deflected by addressing one of the two address electrodes 20 with a voltage to generate electrostatic attraction forces between mirror 12 and the addressed address electrode 20. Preferably, a bias voltage is applied to mirror 12 to initiate the deflection. The generated electrostatic attraction forces pull the mirror 12 downward until the respective landing tip 24 of mirror 12 lands upon and engages the corresponding landing electrode 22. In the stable state, incident light (not shown) is modulated by mirror 12 and directed into either a light absorber, or directed into a projection lens of a darkfield optics system to generate a light image. Each pixel 10 of the area array (not shown) modulates the respective portion of incident light, whereby the pixel array together generates a light image which is focused by the projector lens to a projector screen, or to an exposure module such as the electrostatic drum of a xerographic printer.

In operation, when the tip 24 of mirror 12 lands upon landing electrode 22, as shown, various retaining forces will maintain the tip 24 of mirror 12 in contact with landing electrode 22, even when the address voltage applied to address electrode 20 and the bias voltage to mirror 12 is removed. These retaining forces are quite complex, and include known and unknown forces including Van der Waals forces, and stiction, which is the tendency of the mirror tip 24 to stick or adhere to the landing electrode 22.

As set forth in commonly assigned U.S. Pat. No. 5,331, 454 to Hornbeck entitled "Low Reset Voltage Process for DMD", passivating the surface of the landing electrodes 22 with an oriented monolayer can decrease the Van der Waals forces and reduce the tendency for the mirror to stick to the landing electrode. An oriented monolayer disclosed in this patent is powered Perfluordecanoic Acid (PFDA). Passivating the landing surface of the landing electrode 22 with a monolayer of PFDA helps prevent the buildup of the Van der Waals forces between the moving and nonmoving elements by lowering the surface energy of the landing electrode.

In commonly assigned patent application Ser. No. 08/239, 497, entitled "PFPE Coatings for Micro-Mechanical Devices", filed May 9, 1994, it is disclosed that the landing electrode be passivated with a layer of perfluoropolyether (PFPE). According to this invention, the PFPE has "self-healing" wear-resistant properties, whereby the molecules can migrate to the location where the mirror landing tip engages the landing electrode when the mirror is spaced therefrom. By passivating the surface of the landing electrode, over time, the voltage needing to be applied to the mirror to reset the mirror does not need to be significantly increased to free the mirror from the landing electrode. Thus, damage to the mirror 12, which could include the mirror snapping off its hinges, can be avoided by minimizing the reset forces applied to remove the mirror tip from the landing electrode 22.

Figure 2:
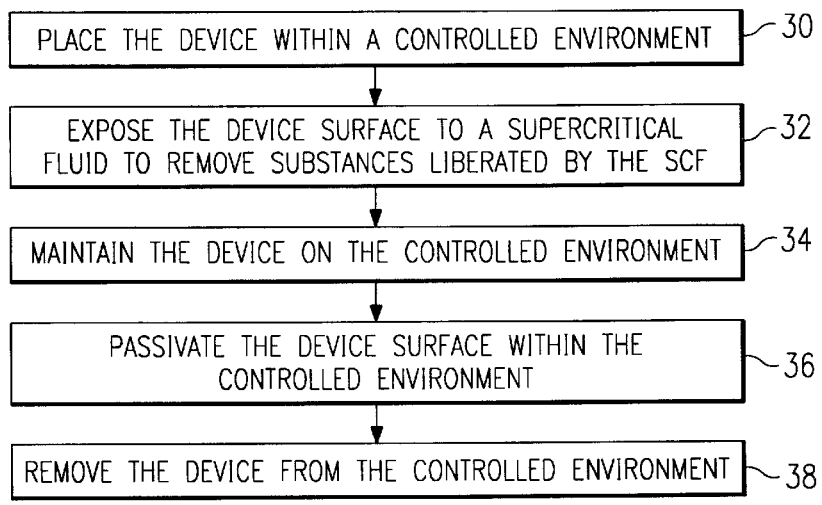
FIG. 2 is a flow diagram of a method according to the present invention for cleaning and passivating a surface of a device such as a landing electrode of a micromechanical device, by which is also suitable for cleaning and passivating other surfaces such as a gate oxide layer of a semiconductor wafer.

Turning now to FIG. 2, a flow diagram of the method according to the preferred embodiment of the present invention is shown. According to the present invention, as exemplified for a DMD, the method set for allows the landing electrode 22 of the pixel 10 to be effectively passivated with a lubricating material. Through proper deposition of the lubricating medium on the micromechanical device, sticking between the contacting components of the micromechanical device during operation is significantly reduced, especially over the significant lifetime of the device. Over time, with the components making repetitive contact being up to $10^{12}$ cycles, operation-related sticking is minimized due to the effective passivation of the landing electrode. It is the unique problem of operation-related stiction forces encountered post-processing of the micromechanical device to achieve reliable operation that is being addressed by the teachings of the present invention.

The method of the present invention comprises essentially three key steps. First, cleaning the device surface with a supercritical fluid (SCF) in a SCF chamber to remove contaminants including soluble chemical compounds, then retaining the cleaned surface in the SCF chamber to preserve the surface integrity of the part so crucial to successful subsequent lubricant application, and finally, passivating the cleaned surface in the SCF chamber with a lubricant, without ever removing the cleaned surface from the SCF chamber. Recognizing the importance of maintaining the cleaned surface in the SCF chamber, without transporting the surface even through a clean room ambient, has been observed in the laboratory to render a subsequently passivated surface effective over an extended period of time, even through extended operation of a device having an element making repetitive contact with the landing electrode.

The present invention derives technical advantages by preserving the SCF cleaned landing electrode free from contaminants, including specifically, organics and other contaminants. If the cleaned surface is not maintained in the SCF chamber, contamination from organics and inorganics that reside in even a Class-1 clean room can preclude a suitable deposition of a passivation layer. The benefits of maintaining the cleaned surface in the SCF chamber post SCF cleaning, and until the surface is passivated, has realized dramatic results. Micromechanical devices are unique in that they endure repetitive contact over the operational life of the device. The present invention addresses the unique environment and operational requirements of a reliable micromechanical device which requires a suitable passivated surface to be maintained over the operational life of the device.

In addition to micromechanical devices, other devices stand to benefit by the method of the present invention as well, including cleaning and passivating a Si surface prior to the growth of a gate oxide on a silicon wafer, or prior to the deposition of subsequent semiconductor materials. A hard disk of memory drives also stand to benefit according to the teachings of the present invention, whereby the useful life of the hard disk drive is extended.

Figure 3:
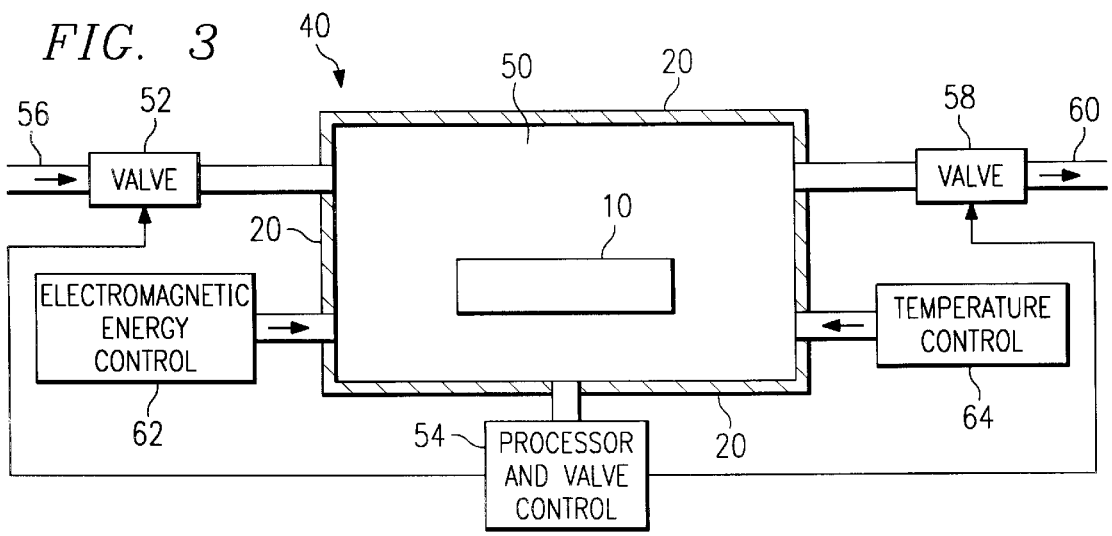
FIG. 3 is a block diagram of an apparatus suitable for carrying out the method of the present invention, including a supercritical fluid chamber having an inlet and an outlet, whereby the device can be placed in the chamber and the device surface cleaned using a supercritical fluid, and then be subsequently passivated without removing the device from the SCF cleaning chamber.

Still referring to FIG. 2 and in view of an apparatus 40 shown in FIG. 3, the method of the present invention is set forth as follows. At step 30, the surface to be cleaned and passivated, such as the landing electrodes 22 of pixel 10 shown in FIG. 1, but could also include a silicon wafer, hard disk etc., is placed within a sealed chamber 50. At step 32, inlet valve 52 is controlled by and opened by a processor and valve control 54, whereby a supercritical fluid, such as carbon dioxide, is introduced into chamber 50 via passageway 56. The SCF fluid liberates contaminants including soluble chemical compounds, such as organic material from the exposed surfaces of the device 10. Processor 54 opens an outlet valve 58 whereby the SCF fluid and liberated soluble contaminants are purged from chamber 50 via passageway 60. The effectiveness of the SCF fluid to clean the exposed surfaces without creating surface tension may be done in many ways, and may be enhanced as well.

Figure 4:
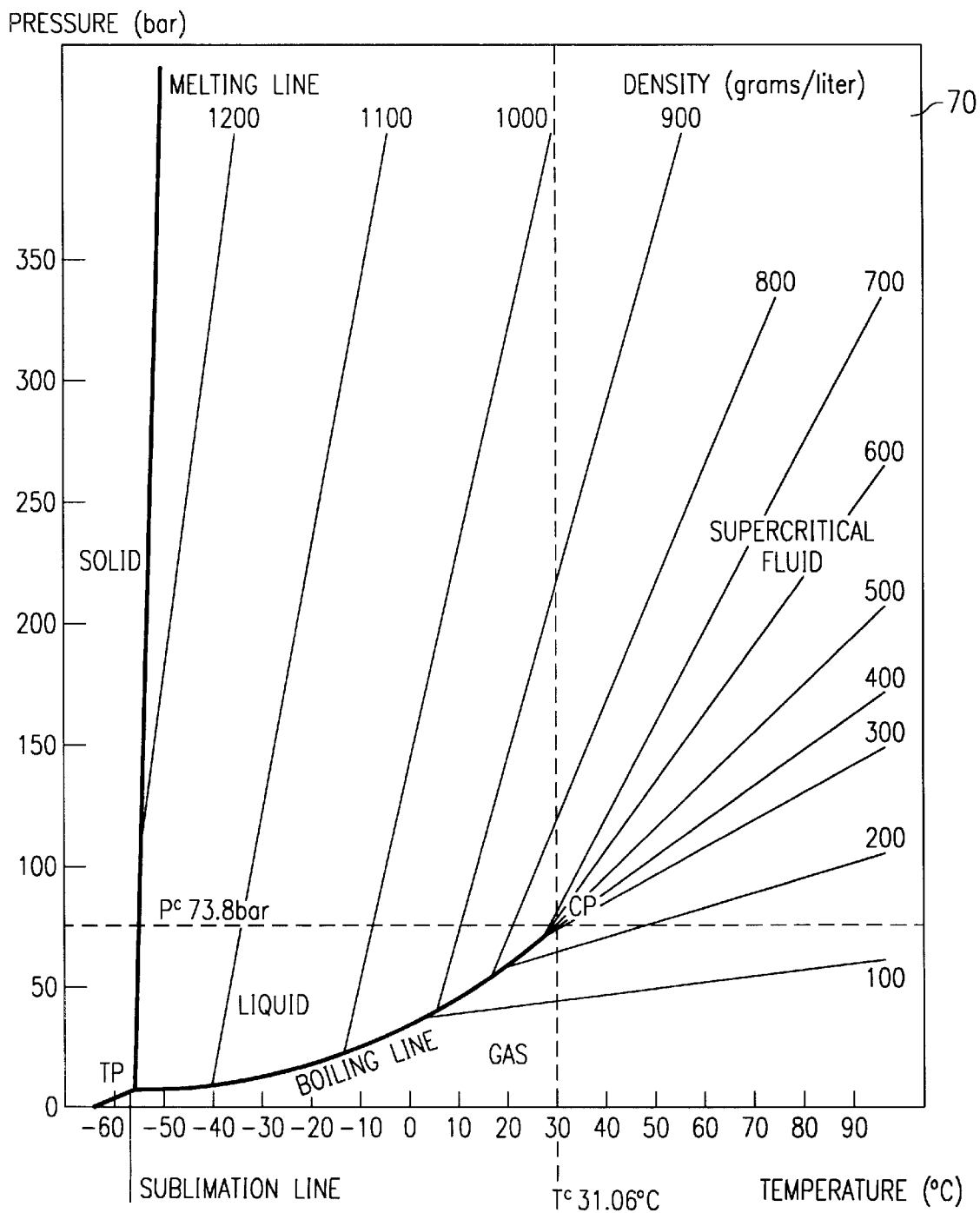
FIG. 4 is a pressure-temperature-density chart for carbon dioxide, illustrating the supercritical fluid region for this fluid.

Referring to FIG. 4, a pressure-temperature-density chart for carbon dioxide is illustrated, with the region generally shown at 70 illustrating when carbon dioxide is above the critical point (CP). As illustrated, carbon dioxide needs to be maintained in a pressure environment above about 75 bar, above a temperature of about 30° Celsius, and at a density above approximately 200 grams per liter. Of course, other supercritical fluids could be used as well, however, carbon dioxide has proven to be a predictable, inexpensive supercritical fluid that is well suited for cleaning objects according to the present invention. As shown in FIG. 3, other process controls including electromagnetic energy control 62 and temperature control 64 also make up and comprise the apparatus 66 suited to perform the method of the present invention as just discussed.

The device, having been placed in the chamber 50, is exposed to the $CO_2$ SCF by, for example, maintaining a chamber/device temperature above $T_c$(=31.06C.) and gradually increasing the pressure until the $CO_2$ is rendered above the critical point, Pc(=73.8 bar). This temperature control 64 is achieved by conductive and radiative heating of the chamber 50 walls. Once the SCF properties have been established, it can be seen from FIG. 4 that variations in pressure at constant temperature, or variations in temperature at constant pressure, will result in a density change of the $CO_2$ SCF. In this way, one may also use the density changes of the SCF to assist in the removal of contaminants from surfaces.

Additionally, the coupling of focused electromagnetic energy 62 onto the device can also be used to provide local temperature changes, and thus SCF density variations, in the immediate vicinity of the device to enhance the cleaning process. This could be accomplished by, for example, the use of a specially designed window affixed to the chamber 50 which permits the passage of electromagnetic radiation. Alternatively, the choice of electromagnetic energy could be dictated by the propensity of the contaminant to undergo a chemical reaction, for example by photon absorption, between the $CO_2$ SCF so as to facilitate the removal of a particular chemical species. For example, fluorocarbon removal would be facilitated by exposure to UV light in the course of the $CO_2$ SCF process.

In yet another embodiment, a specific cleaning additive, chosen so as to result in a chemical reaction with surface contaminants, such as organics, is dissolved in the $CO_2$ SCF environment. The additive is chosen so as to facilitate the removal of the contaminant through chemical attack which liberates the contaminant from the surface to be swept away in subsequent purging steps.

Now, in step 34, the device 10 just cleaned by the SCF fluid is maintained within the sealed chamber 50 to avoid any contaminants, including organic material on the molecular level, from contaminating the cleaned surfaces of device 10, including the landing electrodes 22 of DMD 10. This step is critical to ensure that the passivating step to follow is truly effective. Should device 10 not be maintained within the sealed SCF chamber, such as being transported through the ambient of a level one clean room, the exposed surfaces could be contaminated with molecular level impurities thus degrading the effectiveness of the subsequent passivation step, and reducing device reliability. It is noted that the chamber 50 could be purged with an inert gas, such as Argon, to serve as a transition medium in which the chemical cleanliness of the surface is also preserved.

Next, in step 36 the device 10 is passivated by introducing a passivant into chamber 50 through passageway 56. The passivant can include, but is not limited to, PFDA and PFPE, as set forth in the commonly assigned patent and patent application previously referenced, or other suitable passivants. By passivating device 10 within chamber 50, and without removal therefrom after the SCF cleaning process, the passivation step is very effective. The quality of the passivation layer has been observed in laboratory results to be dramatic, thus providing for extended operation of device 10 without significant stiction of the mirror to the landing electrode. This is important for a device which may experience over its lifetime up to $10^{12}$ cycles. The passivated surface, in turn, alleviates the need to increase the reset voltage that is applied to the mirror 12 to effect a reset operation over the extended operational life of the device. Thus, device reliability is dramatically improved, as is device yield and performance. As stiction is somewhat of a phenomenon in the area of physical sciences, performing the method of the present invention is very effective to reduce stiction, and also to reduce the surface energy of the landing electrode to minimize any associated Van der Waals forces that may exist between the landing electrode and the deflectable mirror.

In the case of micromechanical devices such as DMD 10 shown in FIG. 1, utilizing a supercritical fluid to clean the device is highly effective to reduce surface tension and avoid damage to very delicate parts, such as mirrors 12 and hinges 14. In some embodiments, it is typical that mirror 12 be approximately 17 microns square, having a thickness of about 2,000 Angstroms. Hinges 14 are typically on the order of about 500 Angstroms in thickness. Hence, it is crucial that a supercritical fluid be utilized to clean these delicate parts without generating any surface tension between the supercritical fluid and the parts. Mirror 12 and hinges 14 may comprise of various materials, including aluminum, aluminum alloys, titanium tungsten, titanium tungsten nitride, or other materials that are well suited for the device and are compatible with robust semiconductor manufacturing processes. Irregardless of the material used to fabricate mirror 12 and hinges 14, it is crucial to maintain the device within sealed chamber 50 until the landing electrode 22 is passivated. This ensures that a good passivation layer is achieved such that the mirror 12 will not significantly stick to the landing electrode, especially over the operational life of the mirror which endures repeated contact with the landing electrode. In the case of a DMD, it is expected that the mirror 12 will endure over a 10 year life time $10^{12}$ cycles. Thus, it can be appreciated how important achieving an effective passivation layer on landing electrode 12 is.

The present invention appreciates the effect contaminants, especially organic contaminants, can have on a landing electrode if they exist during the passivation process. Again, it is simply not enough to maintain the device in a clean room during transportation to a separate passivating apparatus if good performance of the device is to be expected over a significant time period. Especially in the case of a micromechanical device which endures repeated mechanical operation, the method of the present invention is crucial to achieve satisfactory operational performance.

As previously mentioned, the method of the present invention is well suited for cleaning other surfaces, including the interface between a semiconductor wafer substrate and a gate oxide layer over said semiconductor wafer, which layer may be on the order of only a few nanometers in thickness, such as 3 nm. By cleaning the semiconductor substrate surface with a supercritical fluid such as carbon dioxide, maintaining the wafer in the SCF chamber, and then growing or depositing the gate oxide layer within the same SCF chamber and without exposing the surface to an ambient such as a clean room, very thin, uncontaminated gate oxide layer interfaces can be both manufactured and preserved until subsequent manufacturing steps can be performed. If the semiconductor wafer is not maintained within the SCF chamber, the quality of the thin gate oxide interface is degraded and may be even totally unsuitable to be further processed, such as subsequent deposition steps, if the gate oxide layer is only about 30 Angstroms in thickness.

In summary, the method of the present invention achieves technical advantages by cleaning a device, especially those of the micromechanical type, with a supercritical fluid to minimize surface tension which could otherwise damage a micromechanical element. Maintaining the cleaned surface in the SCF chamber until and during the subsequent passivation step avoids contaminants on the molecular level, including organics, from contaminating the cleaned surface. By passivating the surface in the SCF chamber, a high quality passivation layer is achieved which is effective over the extended life of the device to increase device reliability, such as 10 years in the case of a DMD device, and increase device yield and performance. In the case of a DMD, the reset voltage required to reset the mirror from a deflected state does not need to be significantly increased over the life of the device to overcome the effects of Van der Waals forces, adhesion and stiction. Thus, it is especially the extended reliable life time of the device that is achieved through the cleaning and passivation process of the present invention.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed:

1. A method of cleaning and treating a device surface, comprising:

placing said device surface in an enclosed and controlled environment;

exposing said device surface to a cleaning medium rendered as a supercritical fluid;

purging said environment of substances including a soluble chemical compound liberated from said device surface by said cleaning medium; and treating said device surface in said enclosed and controlled environment by depositing a lubrication passivant before said device surface is removed from said environment to prevent contaminants from depositing upon said device surface prior to said treatment.

2. The method of claim 1 wherein said cleaning medium comprises a cleaning additive.

3. The method of claim 1 further comprising varying a density of said cleaning medium.

4. The method of claim 1 further comprising varying a thermodynamic state of said cleaning medium.

5. The method of claim 1 further comprising irradiating said device surface to increase a reactivity between said cleaning medium and said device surface.

6. The method as specified in claim 1 wherein an inert gas is used to purge said environment.

7. A method for cleaning and treating a micro mechanical device, comprising:

placing said device in a sealed chamber;

introducing into said chamber a cleaning medium rendered as a supercritical fluid;

flushing from said chamber substances liberated from said device and said chamber by said cleaning medium; and introducing into said chamber a treating medium forming a lubricating film on said device after said step of flushing and before said device is removed from said chamber to preserve said device until treating said device with said treating medium.

8. The method of claim 7 wherein said cleaning medium comprises a cleaning additive dissolved in said cleaning medium to enhance an effectiveness of said cleaning medium.

9. The method of claim 7 further comprising varying a temperature of said cleaning medium to vary a density of said cleaning medium to enhance a cleaning effectiveness of said cleaning medium.

10. The method of claim 7 further comprising varying a temperature of said cleaning medium to vary a thermodynamic state of said cleaning medium.

11. The method of claim 7 further comprising varying a temperature of said device to vary a density of said cleaning medium within a region surrounding said device.

12. The method of claim 7 further comprising introducing a transitioning medium into said chamber between said steps of introducing said cleaning and said treating mediums.

13. The method of claim 7 wherein said cleaning medium comprises carbon dioxide.

14. The method of claim 7 wherein said cleaning medium comprises an additive whose molecules form micelles with particles attached to said device to enhance an ability of said cleaning medium to dislodge said particles.

15. The method of claim 7 wherein said cleaning medium comprises an additive whose molecules attach to said device, further comprising irradiating said molecules to vary a temperature of said device to vary a density of said cleaning medium within a region surrounding said device.

16. The method of claim 7 wherein said film protects said device.

17. The method of claim 7 wherein said treating medium chemically modifies said devise.

18. The method as specified in claim 7 wherein an inert gas is used to flush said chamber.

19. A method of processing a wafer, comprising the steps of:

a) placing a wafer having a wafer surface in an enclosed and controlled environment;

b) exposing said wafer surface to a cleaning medium rendered as a supercritical fluid;

c) purging said environment of substances including a soluble chemical compound liberated from said wafer surface by said cleaning medium; and d) applying a material on said wafer surface while said wafer remains in said enclosed and controlled environment to prevent contaminants from depositing upon said wafer surface prior to said material application.

20. The method as specified in claim 19 further comprising the step of depositing a layer of gate oxide as said material on said wafer surface, thereby providing an uncontaminated gate oxide-wafer surface interface.

21. The method as specified in claim 19 further comprising the step of growing a layer of gate oxide as said material on said wafer surface, thereby providing an uncontaminated gate oxide-wafer surface interface.

22. The method as specified in claim 19 comprising the step of applying a lubricating film as said material on said wafer surface.

23. The method as specified in claim 22 wherein said film is formed as a monolayer.

* * * * *